US006946834B2

(12) United States Patent
Van Zon et al.

(10) Patent No.: US 6,946,834 B2
(45) Date of Patent: Sep. 20, 2005

(54) METHOD OF ORIENTING AN AXIS OF MAGNETIZATION OF A FIRST MAGNETIC ELEMENT WITH RESPECT TO A SECOND MAGNETIC ELEMENT, SEMIMANUFACTURE FOR OBTAINING A SENSOR, SENSOR FOR MEASURING A MAGNETIC FIELD

(75) Inventors: Joannes Baptist Adrianus Dionisius Van Zon, Eindhoven (NL); Jacobus Josephus Maria Ruigrok, Eindhoven (NL); Carsten Giebeler, Edinburgh (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 310 days.

(21) Appl. No.: 10/113,041

(22) Filed: Apr. 1, 2002

(65) Prior Publication Data

US 2002/0180433 A1 Dec. 5, 2002

(30) Foreign Application Priority Data

Jun. 1, 2001 (EP) ........................................... 01202136

(51) Int. Cl.[7] ................................................ G01R 33/02
(52) U.S. Cl. ....................................... 324/252; 324/249
(58) Field of Search ................................ 324/244, 249, 324/252; 438/3; 360/314–315, 324, 324.1, 324.11, 324.12; 365/158, 171, 173

(56) References Cited

U.S. PATENT DOCUMENTS 6,636,391 B2 * 10/2003 Watanabe et al. ........... 360/321

FOREIGN PATENT DOCUMENTS

WO WO0010023 8/1999 ........... G01R/33/09
WO WO0079298 6/2000 ........... G01R/33/09

* cited by examiner

*Primary Examiner*—Bot LeDynh
(74) *Attorney, Agent, or Firm*—Aaron Waxler

(57) ABSTRACT

A method of orienting the axis of magnetization of a first magnetic element with respect to a second magnetic element uses a first element and a second element lying on a substrate. Each of the elements has a magnetic layer with an axis of magnetization. The method includes depositing a pattern of flux-concentrating material close to the first element and subsequently orienting the axis of magnetization of the first element in an applied magnetic field. The semi-finished article for measuring a magnetic field includes a substrate, a first magnetic element, a second magnetic element, a third magnetic element and a fourth magnetic element on the substrate in a bridge configuration. A first bridge portion is provided wherein the first element and the second element are electrically connected in series. A second bridge portion is provided wherein the third element and the fourth element are electrically connected in series.

12 Claims, 6 Drawing Sheets

Figure 1A:
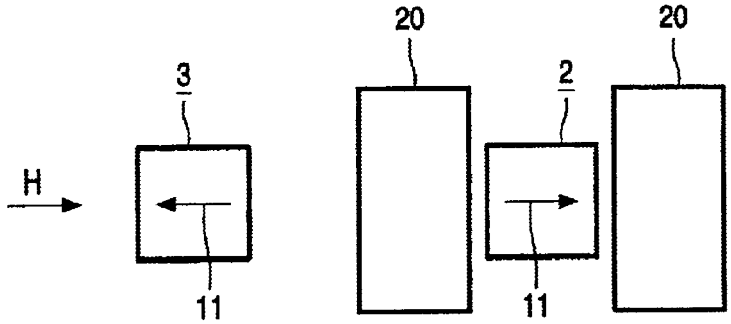

METHOD OF ORIENTING AN AXIS OF MAGNETIZATION OF A FIRST MAGNETIC ELEMENT WITH RESPECT TO A SECOND MAGNETIC ELEMENT, SEMIMANUFACTURE FOR OBTAINING A SENSOR, SENSOR FOR MEASURING A MAGNETIC FIELD

The invention relates to a method of orienting an axis of magnetization of a first magnetic element with respect to a second magnetic element, wherein the first magnetic element and the second magnetic element are present on a substrate, and each of the magnetic elements comprises at least a magnetic layer having an axis of magnetization.

The invention also relates to a semimanufacture for obtaining a sensor, comprising a substrate, a first magnetic element, a second magnetic element, a third magnetic element and a fourth magnetic element on the substrate in a bridge configuration comprising, between a first and a second contact, a first bridge portion wherein the first and the second element are arranged in series and a second bridge portion wherein the third and the fourth element are arranged in series, each one of the magnetic elements comprising at least a magnetic layer with an axis of magnetization, the axes of magnetization of the magnetic layers of the elements in the first bridge portion and the axes of magnetization of the magnetic layers of the elements in the second bridge portion being oriented so as to extend in opposite directions, and, near each one of the contacts, the axis of magnetization of the element of one bridge portion being oppositely oriented to the axis of magnetization of the element of the other bridge portion.

The invention also relates to a sensor for measuring a magnetic field, comprising a substrate, a first magnetic element, a second magnetic element, a third magnetic element and a fourth magnetic element on the substrate in a bridge configuration comprising, between a first and a second contact, a first bridge portion wherein the first and the second element are arranged in series and a second bridge portion wherein the third and the fourth element are arranged in series, each one of the magnetic elements comprising at least a magnetic layer with an axis of magnetization, the axes of magnetization of the ferromagnetic layers of the elements in the first bridge portion and the axes of magnetization of the ferromagnetic layers of the elements in the second bridge portion being oriented so as to extend in opposite directions, and, near each one of the contacts, the axis of magnetization of the element of one bridge portion being oppositely oriented to the axis of magnetization of the element of the other bridge portion.

In EP 0710850 a description is given of a method wherein an electric conductor is provided in the vicinity of the first magnetic element, which electric conductor is electrically insulated from the magnetic elements. By sending a current of several hundred mA through the conductor, a magnetic field of typically 150 Oe is locally generated at the location of the magnetic layer of the first magnetic element. Said locally generated magnetic field causes the axis of magnetization of the magnetic element to be oriented in the direction of the generated magnetic field, while the axis of magnetization of the second magnetic element retains its original orientation.

A drawback of the known method resides in that said method cannot be generally applied to orient the axis of magnetization of different magnetic materials. To orient the axis of magnetization of a large number of magnetic materials, typically, magnetic fields of several thousand oersteds are required. The magnetic fields that can be generated by sending an electric current through a conductor are much smaller. In addition, only a limited number of magnetic elements can be simultaneously oriented because the length of the conductor must not become too large as this would lead to a high series resistance causing too high a dissipation at a large current and damage to the conductor.

It is an object of the invention to provide a method of the type described in the opening paragraph, which enables the axis of magnetization of different magnetic materials to be readily oriented.

The object of the invention is achieved, in accordance with the invention, in that the axis of magnetization of the magnetic layer of the first magnetic element is oriented by providing a pattern of flux-concentrating means close to at least the first magnetic element and subsequently applying a magnetic field.

The pattern of flux-concentrating means may be, for example, a pattern of a flux-conducting material. The magnetic elements may be part of, for example, a magnetic sensor or a magnetic read accessible memory (MARM). In an applied magnetic field, the pattern of flux-concentrating means concentrates the magnetic flux through the first element. As a result, the magnetic flux through the magnetic layer of the first magnetic element substantially exceeds the magnetic flux through the magnetic layer of the second magnetic element. The second magnetic element is subject only to a comparatively small magnetic field, as a result of which the direction of magnetization of the second magnetic field is influenced to a small degree only. In this manner, it is possible, using a comparatively small applied magnetic field, to orient the axis of magnetization of the magnetic layer of the first element with respect to the axis of magnetization of the magnetic layer of the second magnetic element.

The magnetic elements can be heated to a temperature at which the axis of magnetization of the first magnetic element with the pattern of flux-concentrating means is reversed so as to extend in the direction of the applied magnetic field. By increasing the temperature, the axes of magnetization receive additional thermal energy as a result of which they are reversed more readily. As a result, orienting the axes of magnetization is made easier. In some material systems, heating is necessary to orient the axis of magnetization. If, for example, the orientation of the axis of magnetization of the magnetic layer is imposed by an exchange biasing layer, an increase of the temperature to a level above the blocking temperature causes the connection between the exchange biasing layer and the magnetic layer to be ended, thereby enabling the orientation of the axis of magnetization of the magnetic layer to be reversed. A possible change in the resistance of the magnetic elements as a result of heating influences the resistance of all magnetic elements in the same way, so that the resistance of all elements remains in essence the same. This is very important to magnetic sensors whose magnetic elements are arranged in a Wheatstone bridge configuration because, by virtue thereof, the offset voltage of the Wheatstone bridge remains comparatively small.

After orienting the axis of magnetization of the magnetic layer of the first magnetic element, the orientation of the axes of magnetization is fixed by cooling in the magnetic field present. In principle, orienting the axis of magnetization is a reversible process. In an applied magnetic field, the axis of magnetization adopts the orientation of the applied magnetic field, but when the magnetic field is switched off the axis of magnetization resumes its original orientation.

Under certain conditions, as occur, for example, in the case of exchange biasing coupling, however, the axis of magnetization retains the orientation imposed by the orientation process when the axis of magnetization is oriented and cooled in the presence of the magnetic field.

In the manufacture of a sensor for measuring a magnetic field, a third and a fourth magnetic element are present on the substrate, which third and fourth magnetic element form a bridge configuration with the first and the second element. Said bridge configuration includes a first bridge portion between a first and a second contact, wherein the first and the second element are arranged in series, and a second bridge portion wherein the third and the fourth element are arranged in series. The third and the fourth magnetic element also comprise at least one magnetic layer having an axis of magnetization. In a magnetic sensor, the magnetic elements are preferably arranged in a bridge configuration, such as a Wheatstone bridge. A bridge configuration is less sensitive to temperature effects. Magnetic sensors are used, inter alia, in the automobile industry for measuring angles, rotational speeds and for determining the position.

For a sensor having magnetic elements based on the giant magnetoresistance (GMR) effect or the tunnel magnetoresistance (TMR) effect, it is favorable if the axes of magnetization of the magnetic layers in the bridge portions are rotated through 180 degrees. If so, at an applied voltage across the first and the second contact, the output signal across the output contacts, which are situated between the first and the second element and between the third and the fourth element, is the maximum signal attainable from the bridge circuit. The orientation of the axis of magnetization of the magnetic layers is generally provided during the deposition of the magnetic layer in a magnetic field. Thus, the axes of magnetization of the magnetic layers initially all have the same orientation.

The pattern of flux-concentrating means is provided near at least one magnetic element, after which the axis of magnetization of said magnetic element is oriented in an applied magnetic field in the manner described hereinabove.

In an applied magnetic field, the pattern of flux-concentrating means, situated near at least one element, concentrates the magnetic flux through the relevant element. The relevant element is subject to a much larger magnetic field than the other elements. The enhancement of the flux is determined to a substantial degree by the width of the pattern of the flux-concentrating means and the width of the magnetic element in the direction of the applied magnetic field. By virtue thereof, it is possible to orient the magnetization of an individual element at a comparatively small applied magnetic field. The other magnetic elements of the bridge are subject to only a comparatively small magnetic field, as a result of which the direction of magnetization of these other elements is influenced only to a small degree. In this manner, it is possible to orient at least one element with respect to the other elements. By subsequently providing a pattern of flux-concentrating means near another magnetic element, for example in the second bridge portion, said element can also be oriented. In a bridge configuration, such as a Wheatstone bridge, the axes of magnetization of the magnetic layers in the bridge portions can be rotated through 180 degrees.

An additional advantage of the flux concentrators is that the applied magnetic field can be less accurately aligned with respect to the magnetic elements. The pattern of flux concentrators is, for example, rectangular and extends parallel to the edges of the magnetic elements, for example on both sides of the magnetic element. If the applied magnetic field is not accurately aligned with respect to the magnetic elements, i.e. instead of extending completely perpendicularly to the rectangular flux-concentrating patterns, said applied magnetic field includes an angle of 80 degrees with the rectangular flux-concentrating patterns, then said rectangular flux concentrators make sure that the magnetic flux between the rectangular flux concentrators still runs perpendicularly through the magnetic element. In the case of a deviation of the direction of the applied magnetic field relative to a magnetic element, the alignment of the rectangular flux concentrators relative to the edges of the magnetic element determines the accuracy with which the axis of magnetization can be oriented. The pattern of flux concentrators can be aligned much more accurately with respect to the magnetic element than the direction of the applied external magnetic field. The accuracy with which the axes of magnetization can be oriented in an applied magnetic field is improved and aligning is made easier.

By providing the pattern of flux-concentrating means close to the first magnetic element of the first bridge portion near the first contact, and providing a similar pattern of flux-concentrating means close to the magnetic element of the second bridge portion near the second contact, the directions of magnetization of said elements can be simultaneously oriented in an applied magnetic field. The orientation of the axis of magnetization of the pinned magnetic layer is essentially identical for the simultaneously oriented elements.

If the patterns are substantially perpendicularly projected onto the magnetic elements, there is substantially no overlap between these patters and said elements. The overlap must be below 50% in order to make sure that the axis of magnetization of the oriented element is 50% oriented according to the directed orientation and 50% according to the original orientation, which is rotated through 180 degrees, as a result of which the magnetization is effectively substantially zero. An overlap below 30% is permissible however. This enables the magnetization of two elements of the bridge portions to be oriented, so that an output signal is obtained which is as large as possible.

In order to screen the magnetic element of the first bridge portion near the second contact and the element of the second bridge portion near the first contact, the pattern of flux-screening means is provided in such a manner that, in the case of a substantially perpendicular projection on the magnetic elements, said elements are at least substantially enclosed. As a small quantity of the magnetic flux passes under the screen, the pattern of screening means preferably has a larger surface area than the magnetic element. In this manner it is achieved that the orientation of the axis of magnetization of the ferromagnetic layer of the magnetic element remains substantially unchanged in the applied magnetic field.

Advantageously, the flux-concentrating patterns as well as the flux-screening patterns are simultaneously manufactured from the same layer of material. By virtue thereof, both the flux-concentrating patterns and the flux-screening patterns can be provided in one step in the proper position relative to the magnetic elements. It is very advantageous in terms of space if the pattern of flux-concentrating means can also be used as a screen.

The material of the layer preferably has a comparatively high magnetic permeability. Preferably, the layer is grown by electroplating, so that also comparatively thick layers can be readily provided. On a thin layer of a satisfactorily conducting material, i.e. the plating base, the pattern of flux-conducting material is grown between a resist pattern.

Subsequently, the resist pattern is removed and the plating base is etched away.

Alternatively, the layer may first be grown by electroplating. By means of standard lithography, a resist pattern is produced. The layer of material having a comparatively high permeability is etched, for example by means of physical or chemical etching, as a result of which the material around the pattern of flux-concentrating means and around the pattern of flux-screening means is removed.

After orienting the axes of magnetization of the magnetic layers in the magnetic field applied, the pattern of flux-screening means and the pattern of flux-concentrating means are removed. A sensor is obtained which can suitably be used to measure magnetic fields.

Optionally, the pattern of flux-concentrating means can be provided again near each magnetic element. As a result of flux concentration by all magnetic elements, the sensor has become more sensitive to the measuring of comparatively small magnetic fields. As a result of the higher sensitivity of the bridge portions, it is also possible to produce a smaller sensor. A smaller surface of the sensor is very advantageous because smaller sensors are less sensitive to gradients in external magnetic fields and fluctuations in temperature during operation.

Optionally, the pattern of flux-screening means can be provided again near each magnetic element. As saturation occurs in the screening means, only a part of the magnetic field passes through the magnetic elements. The sensor can nevertheless be used to measure comparatively large magnetic fields.

The invention also aims at providing a semimanufacture of the type described in the opening paragraph, by means of which a compact sensor with accurately oriented axes of magnetization is obtained.

The object of the invention regarding the semimanufacture for obtaining a sensor in accordance with the invention is achieved in that magnetic flux-concentrating means are present for the first element of the first bridge portion and for the element of the second bridge portion having the same orientation of the axis of magnetization as the first element.

It is favorable for the eventual sensor comprising magnetic elements based on the giant magnetoresistiance (GMR) effect or on the tunnel magnetoresistance (TMR) effect if the axes of magnetization of the magnetic layers in the bridge portions are rotated through 180 degrees. If so, at an applied voltage between the first and the second contact, the output signal across the output contacts, which are situated between the first and the second magnetic element and between the third and the fourth magnetic element of the bridge circuit, is the maximum output signal attainable from the bridge. By means of the flux-concentrating means, the axes of magnetization of the magnetic layers, the so-called pinning layers, in the bridge portions are rotated through 180 degrees in an applied magnetic field. Preferably, the other magnetic elements in the bridge are screened, during the orientation process, from the applied magnetic field by flux-screening means.

The flux-screening means are present for the second element of the first bridge portion and for the element of the second bridge portion having the same orientation of the axis of magnetization as the second element.

If the flux-screening means remain on the Wheatstone bridge, they will largely stop the field to be measured on a part of the Wheatstone bridge. As a result, only half the output signal issues from the bridge. The flux-concentrating means are situated on the other part of the bridge, as a result of which said bridge portion becomes much more sensitive. A bridge that is out of balance cannot be used properly, so that in the eventual sensor, the flux-concentrating means and the flux-screening means are removed from the semimanufacture.

Preferably, each magnetic element comprises at least one magnetic path, but generally each magnetic element comprises a plurality of magnetic paths which are connected in series by a metal so as to obtain a high resistance value of, for example, several kOhhms. This is an advantageous value for the input impedance of an amplifier, which is situated in an electronic circuit at the output of the bridge circuit. The direction of magnetization is preferably at right angles to the paths.

Preferably, the magnetic flux-concentrating means comprise a number of juxtaposed strips. The contours of these strips are such that they are situated at least substantially outside the magnetic paths of the magnetic elements in the case of a substantially perpendicular projection on the magnetic elements. The ratio of the width of the strips to the width of the magnetic paths in the direction of the applied field determines the flux enhancement. The flux enhancement is uniform through the magnetic elements. If the strips, viewed in a perpendicular projection, connect seamlessly to the magnetic paths, eventually an advantageous configuration is obtained to form a compact sensor. If, however, there is some overlap between the strips and the magnetic paths, then the part of the magnetic paths demonstrating overlap is not oriented in the applied magnetic field. For example an insulator, such as aluminum oxide, silicon nitride or silicon oxide is present between the magnetic elements and the strips. Favorably, the permeability of the material of the strips is very high, of the order of 1000. A few suitable materials are, for example, NiFe, CoNbZr or FeAlSi.

Favorably, the magnetic flux-screening means comprise a number of juxtaposed strips, which strips have edges, and, in the case of a substantially perpendicular projection of the flux-screening means on the magnetic elements, the magnetic paths of the magnetic elements are situated substantially within these edges. As the enclosure of the screening strips over the magnetic paths is larger, a more homogeneous screening across the magnetic element is obtained. Preferably, the distance between the magnetic paths and the strips of the screening means is small. In the case of a large thickness and high permeability, the magnetic flux passes almost entirely through the flux-conducting strips. It is important that the material of the strips does not become saturated in the applied magnetic field. The reason for this being that in the case of saturation, the remaining flux passes through the magnetic elements. Dependent upon the material, but particularly for layers that are pinned by means of exchange biasing, a value of the magnetic field of several thousand oersteds is necessary to orient the axis of magnetization of the magnetic layer. In this manner, a saturation magnetization of the material of the screening strips is obtained which is at least well above this value.

In terms of space, it is advantageous if the magnetic paths of each magnetic element are meanders and said meanders are nested. By nesting the meanders, in addition, a high degree of uniformity in the material of the magnetic elements is obtained. Local temperature effects are less serious because all magnetic elements in the bridge are substantially identically located and hence their temperature is substantially identical. The flux-concentrating means, which preferably run in the form of strips parallel to the meandering paths, may be simultaneously used as flux concentrators for the first element and flux screens for the element near the first contact of the second bridge portion. After orienting the magnetic elements, the strips are removed. The sensor is ready for measuring a magnetic field.

A substantial advantage resides in that nesting causes the sensor to take up a much smaller space. In addition, the sensor's offset and drift in offset voltage in the magnetic field to be measured are reduced.

In terms of space, it is even more advantageous for the meanders to be bent so as to be U-shaped. The flux-concentrating means, which preferably extend in the form of strips parallel to the meandering paths, can be used simultaneously as flux concentrators for the first element and as flux screens for the second element. After orienting the magnetic elements and removing the strips, the sensor takes up a minimum amount of surface space. To contact the elements, only a single, structured conductor is necessary. In addition, the contacts are now situated on one side, as a result of which the sensor can be more readily contacted, for example by means of bonding.

The invention further aims at providing a sensor of the type described in the opening paragraph, which is more sensitive to comparatively small magnetic fields.

The object of the invention regarding the sensor is achieved in that magnetic flux-concentrating means are present for each magnetic element.

As the flux-concentrating means enhance the magnetic field through all magnetic elements, the sensitivity of the bridge portions to the magnetic field to be measured is increased. The sensor is capable of measuring comparatively small magnetic fields with increased sensitivity.

As a result of the greater sensitivity of the bridge portions, it is also possible to manufacture a smaller sensor. A smaller surface area of the sensor is very advantageous because smaller sensors are less sensitive to gradients in external magnetic fields and fluctuations in temperature during operation.

With reference to the claims it is noted that combinations of different characteristics as defined in the claims are possible.

These and other aspects of the method in accordance with the invention will be explained in greater detail with reference to the embodiment(s) described hereinafter.

Figure 1B:
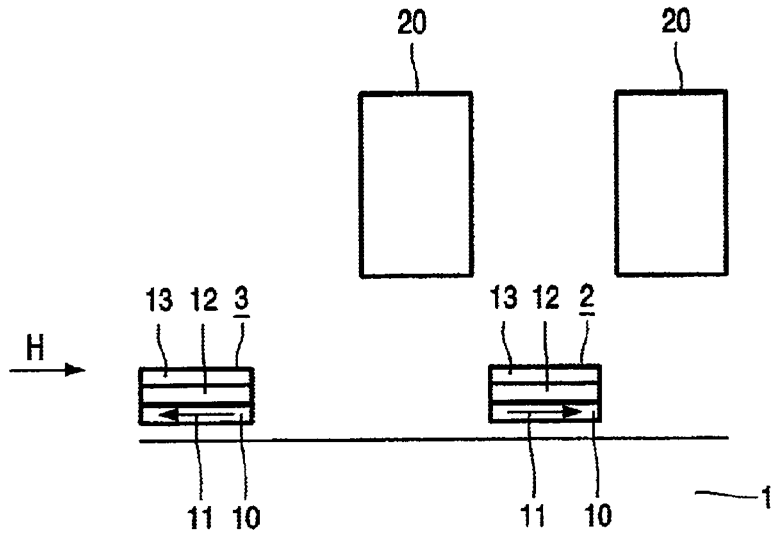
Figure 1C:
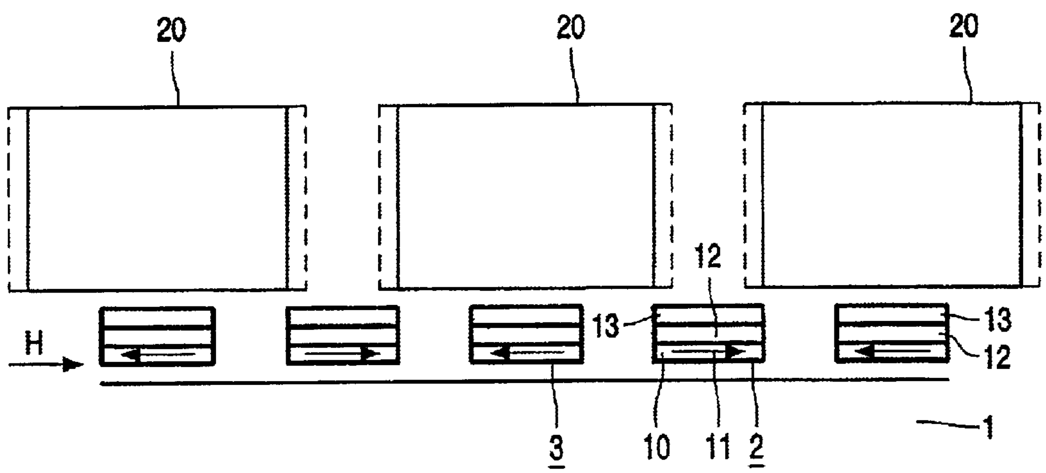
Figure 2:
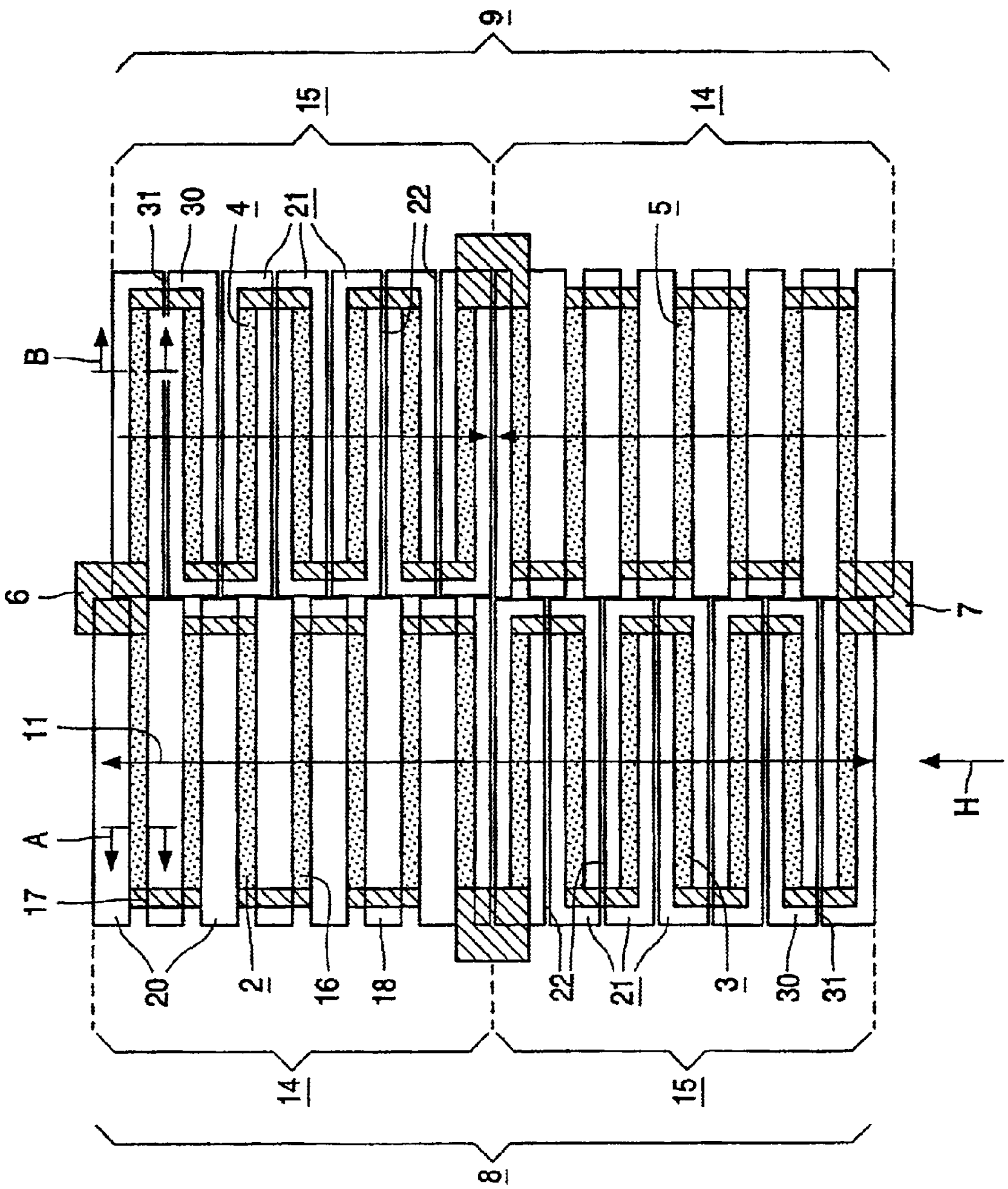
Figure 2A:
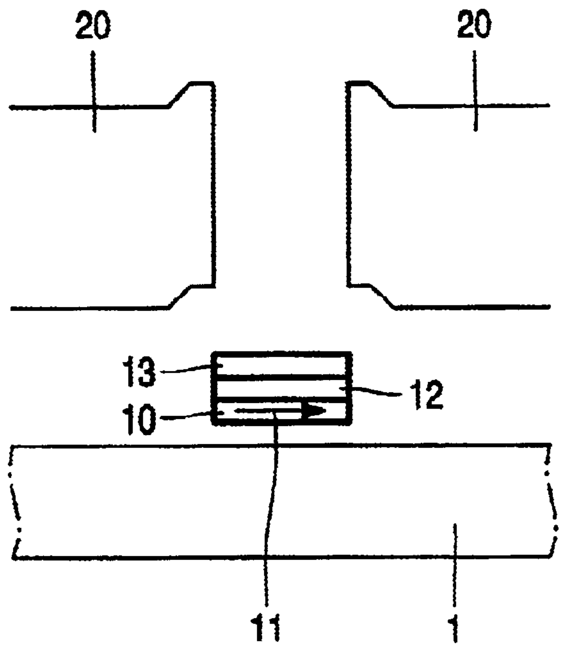
Figure 2B:
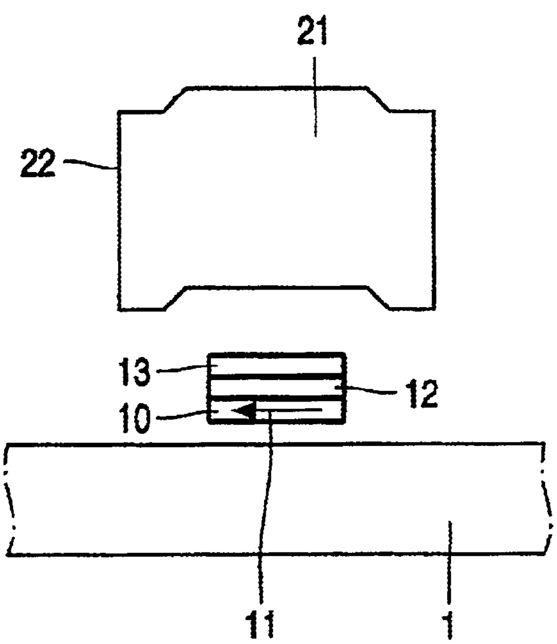
Figure 2C:
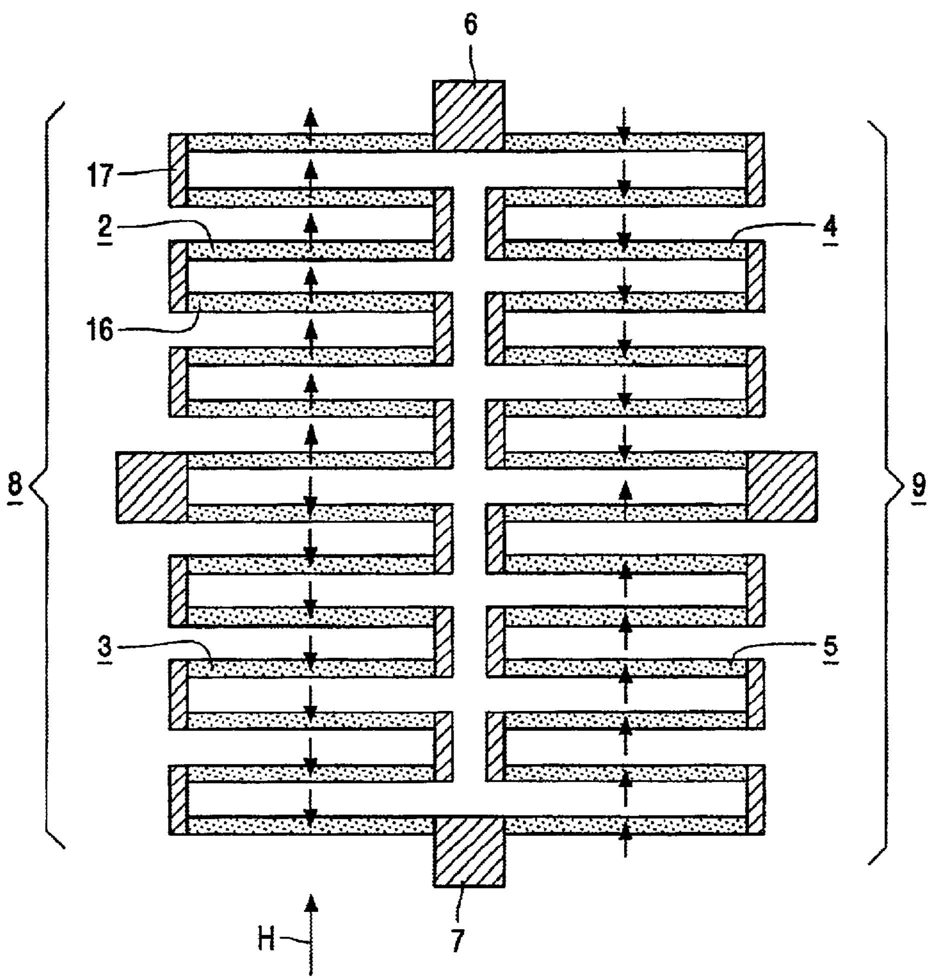
Figure 3A:
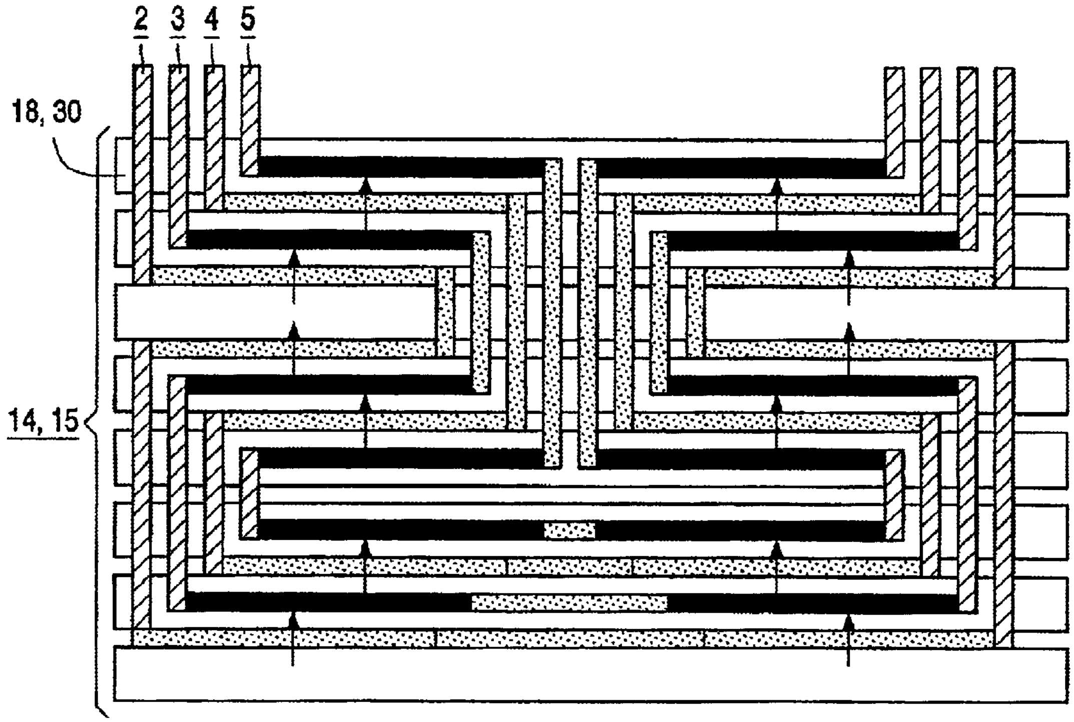
Figure 3B:
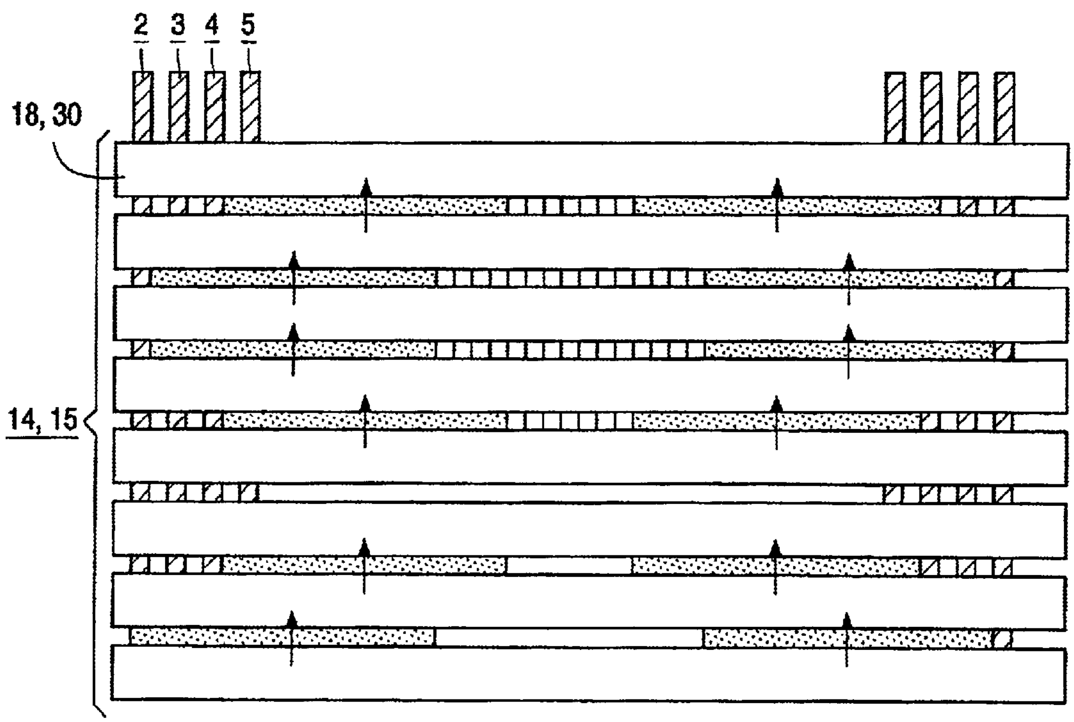
Figure 3C:
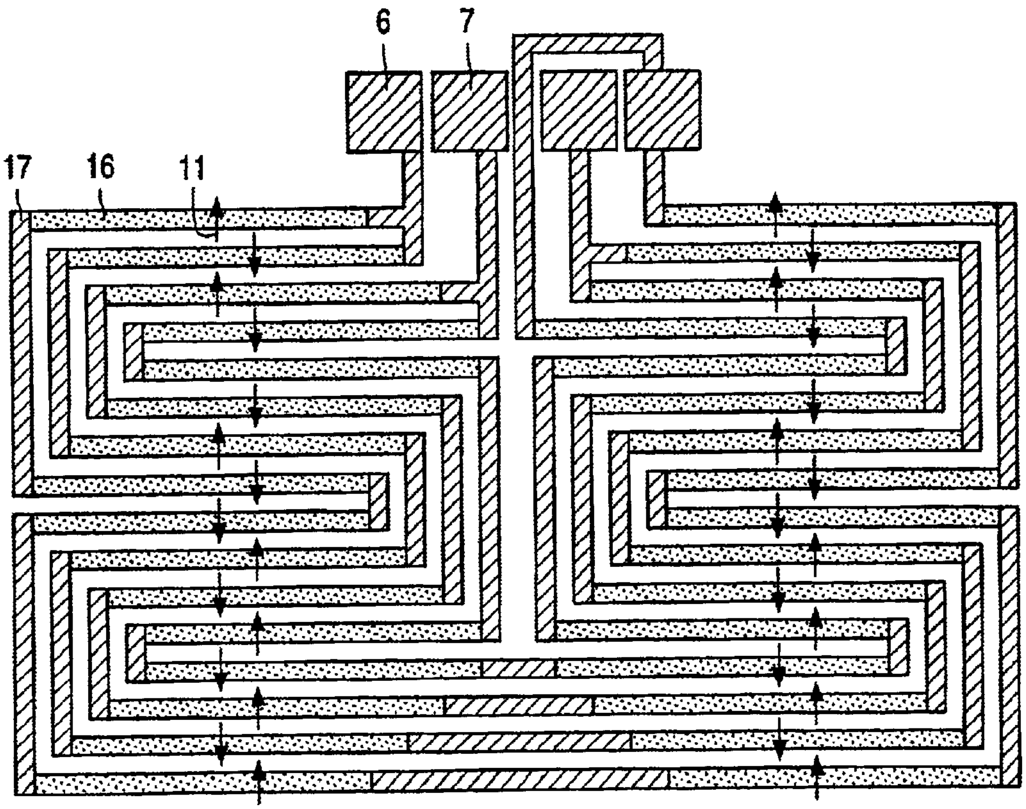
Figure 4:
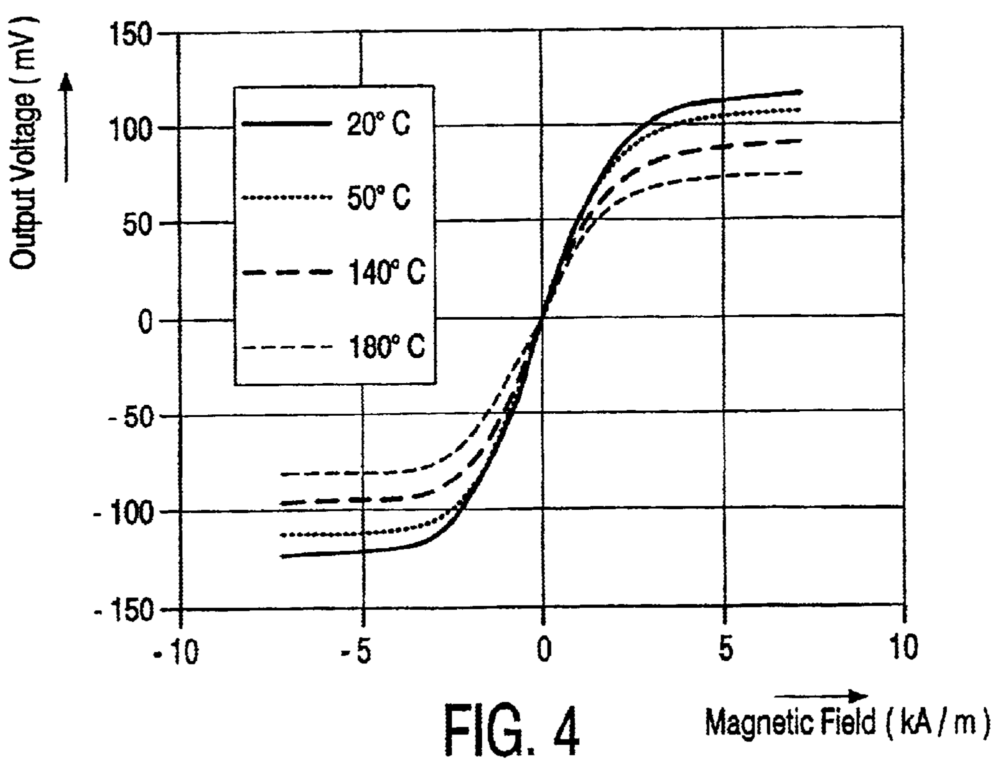

In the drawings:

FIG. 1*a* is a plan view of the intermediate product after the provision of the pattern of flux-concentrating means;

FIG. 1*b* is a cross-sectional view of the intermediate product after the provision of the pattern of flux-concentrating means;

FIG. 1*c* is a cross-sectional view of the intermediate product after the provision of the pattern of flux-concentrating means, which pattern can also suitably be used as a pattern of flux-screening means for other magnetic elements;

FIG. 2 is a plan view of a first embodiment of the semimanufacture in accordance with the invention;

FIG. 2*a* is a cross-sectional view of a part of the semimanufacture of the first embodiment taken on the line A—A;

FIG. 2*b* is a cross-sectional view of a part of the semimanufacture of the first embodiment taken on the line B—B;

FIG. 2*c* is a plan view of a first embodiment of the sensor manufactured from the semimanufacture;

FIG. 3 shows a second embodiment of the semimanufacture and the sensor manufactured therefrom;

FIG. 3*a* is a plan view of a second embodiment of the semimanufacture in accordance with the invention;

FIG. 3*b* is a plan view of a modification of the second embodiment of the semimanufacture in accordance with the invention;

FIG. 3*c* is a plan view of a second embodiment of the sensor;

FIG. 4 shows an output characteristic of the sensor in accordance with the first embodiment.

In the method of orienting an axis of magnetization of a first magnetic element 2 with respect to a second magnetic element 3, as shown in FIG. 1, the first magnetic element 2 and the second magnetic element 3 are present on a substrate 1. The magnetic elements may be part of a magnetic sensor for reading a magnetic field in a head for a hard disk or a tape, or they may be part of, for example, a magnetic memory (MRAM).

Each one of the magnetic elements 2, 3 comprises at least a magnetic layer 10 with an axis of magnetization 11. The magnetic elements of the sensor may be spin valves or magnetic tunnel junctions. A spin valve structure based on the GMR effect can be manufactured as follows. A substrate 1 is provided with a multilayer structure comprising, in succession, a buffer layer of, for example, 3.5 nm Ta/2.0 nm Py to induce the proper material structure, in this case the (111) texture, a magnetic layer 10 with an axis of magnetization 11 as the pinning layer, comprising

- an exchange biasing layer of 10 nm $Ir_{19}Mn_{81}$ and an artificial anti-ferromagnet of 3.5 nm $Co_{90}Fe_{10}$/0.8 nm Ru/3.0 nm $Co_{90}Fe_{10}$,
- a non-magnetic spacer layer 12 of 3 nm Cu, and
- a ferromagnetic layer 13 of 5.0 nm Py: the free layer (below which extends, for example, a thin layer of 1.0 nm $Co_{90}Fe_{10}$ which enhances the GMR effect and limits the interlayer diffusion, resulting in an increased thermal stability). For the protection layer use is made of 10 nm Ta which is applied to the multilayer.

Alternatively, the magnetic elements may be magnetic tunnel junctions comprising, for example, the following multilayer structure: a buffer layer of 3.5 nm Ta/2.0 nm NiFe, an exchange biasing layer and a pinning layer (AAF) as the magnetic layer of 15.0 nm IrMn/4.0 nm CoFe/0.8 nm Ru/4.0 nm CoFe, a non-magnetic spacer layer of 2.0 nm $Al_2O_3$, and, as the free layer, a second ferromagnetic layer of, for example, 6.0 nm CoFe.

The layers are provided, for example, by means of sputtering in such a manner that all layers are provided in one deposition operation so as to make sure that clean interfaces and uniformity among the magnetic elements is achieved. To the extent possible, all elements have the same magnetoresistance effect and the same temperature coefficient. As the layers are deposited in an applied magnetic field of 150 oersteds, the axes of magnetization 11 of the ferromagnetic layers 10 of all magnetic elements 2, 3 hitherto extend in the same direction.

The axis of magnetization 11 of the magnetic layer 10 of the first magnetic element 2 is oriented with respect to the second magnetic element 3 by providing a pattern of flux-concentrating means 20 close to at least the first magnetic element 2 and subsequently applying a magnetic field H. FIG. 1*b* is a cross-sectional view of the intermediate product after the provision of the pattern of flux-concentrating means 20. The pattern is, for example, a structured layer of a flux-conducting material, such as NiFe.

It is alternatively possible that the pattern 20 has been provided before the magnetic elements are provided. In the applied magnetic field H, the axis of magnetization 11 of the first magnetic element 2 is oriented.

The requirements for the magnetic field of the layer structure shown are approximately as follows:

1. To rotate the direction of magnetization, a magnetic field above approximately 2000 Oe is required.

2. The direction of magnetization is not rotated if the magnetic field is smaller than 30–40 Oe.

The flux-concentrating means 20 enhance the magnetic flux by a factor of approximately 70 in this embodiment of the method that is not drawn to scale. The applied magnetic field only has to be 30 Oe, while the flux-concentrating means 20 bring about a field above 2000 Oe. Although the magnetic flux can be enhanced by a factor of 70, this is not very practical in general because the flux conductors must be 70 times as large as the magnetic element. As a result, a small sensor is impossible.

Before being oriented, the magnetic elements 2, 3 are heated to a temperature above the blocking temperature of the anti-ferromagnetic material, as a result of which the AAF layer that is pinned via exchange coupling is uncoupled from the anti-ferromagnetic layer. $Ir_{19}Mn_{81}$ (the exchange biasing layer) is used as the exchange biasing material because of the high blocking temperature (approximately 560 K) that enables a good stability at a changing temperature to be obtained. By using an AAF pinning layer, an excellent magnetic stability is obtained by virtue of the small net magnetization. Temperatures at which heating takes place typically are around 560 K. Subsequently, the heated magnetic elements are exposed to a magnetic field whose field strength is sufficient to rotate the direction of magnetization of the exchange biasing layer of the first magnetic element 2, the original direction of magnetization of the second element 3 being substantially maintained.

Subsequently, the magnetic elements are cooled to room temperature in the presence of a constant magnetic field. Typical values of the magnetic field used to orient the magnetic elements lie around 30 Oe.

In FIG. 1*c*, a very advantageous method is shown. The flux-concentrating means are also used to screen the flux in the adjoining magnetic elements. The dashed lines indicate that, viewed in a perpendicular projection, there may be some overlap between the flux-concentrating means and the magnetic element 2. In the embodiment shown in FIG. 2, this method is used.

In the Wheatstone bridge configuration shown in FIG. 2, a third magnetic element 4 and a fourth magnetic element 5 are present on the substrate 1. In a first bridge portion 8 between a first contact 6 and a second contact 7, the first element 2 and the second element 3 are electrically arranged in series. In a second bridge portion 9, the third element 4 and the fourth element 5 are arranged in series. The third magnetic element 4 and the fourth magnetic element 5 are identical, in terms of layer structure, to the first magnetic element 2 and the second magnetic element 3.

As regards the sensor that is finally obtained, the operation of which is based on GMR or TMR elements, the output signal of the Wheatstone bridge is the maximum output signal that can be attained if the axes of magnetization of the diagonal elements are equally oriented, yet rotated through 180 degrees with respect to the other diagonal elements. The pattern of flux-concentrating means 20 is provided near at least one magnetic element, after which said element is oriented in the applied magnetic field. Individually orienting the magnetic elements, however, is more laborious than simultaneously orienting the diagonal elements of the bridge configuration. In the cross-sectional views shown in FIG. 2*a*, the pattern of flux-concentrating means 20 is provided near the first magnetic element 2 and the diagonal element 4. The pattern of flux-concentrating means 20 causes the magnetic flux in this configuration to be enhanced by a factor of approximately 4. An applied magnetic field of 550 Oe causes the magnetic field to locally exceed 2000 Oe, as a result of which the first magnetic element 2 and the diagonal element 4 are simultaneously oriented with respect to the other magnetic elements 3, 5 in the bridge configuration when the temperature exceeds the blocking temperature.

To preclude that the axes of magnetization of the other magnetic elements 3, 5 are subject to a small degree of rotation in the applied magnetic field, flux-screening means are provided. In FIG. 2*b*, the flux-screening means are provided in the form of a pattern 21 having edges 22. At a substantially perpendicular projection thereof on the magnetic elements, said magnetic elements 3, 5 are completely situated, at least in this embodiment, within the edges 22. At an applied magnetic field of 550 Oe, the magnetic flux is weakened by a factor of 15–20 by the screened magnetic elements 3, 5, and the magnetic field remains smaller than 30 Oe. The axes of magnetization of the screened magnetic elements 3, 5 retain their original orientation.

The flux-concentrating patterns 20 and the flux-screening patterns 21 can be manufactured simultaneously. On a plating base of, for example, 66 nm $Ni_{80}Fe_{20}$, a resist pattern is provided by means of standard optical lithography. Between the resist pattern, a layer of $Ni_{80}Fe_{20}$ having a thickness t of, for example, 4 nm is provided by electroplating. Subsequently, the resist pattern is removed and the plating base is etched away. $Ni_{80}Fe_{20}$ has a high permeability value of 2000.

For the screening effect, it is important that the demagnetization field $H_{dem}$ of the patterned $Ni_{80}Fe_{20}$ is larger than the applied magnetic field used to orient the magnetic elements. The demagnetization field depends on the shape of the pattern and is expressed by the following approximation: $H_{dem}$==t /W$B_{sat}$, where W is the width of a screening strip in FIG. 2. $Ni_{80}Fe_{20}$ has a saturation magnetization $B_{sat}$ of approximately $10^4$ oersteds at room temperature. To orient the magnetic layer of the layer structure shown, an applied magnetic field of approximately 2000 Oe is necessary. As a result, at an assumed thickness of 4 nm, the pattern has a width W of approximately 18 nm to obtain complete screening. The distance between the flux-screening strips and the magnetic element is preferably as small as possible. In the embodiment shown, the distance is 150 nm.

The sensitivity of the bridge increases considerably when the patterns of flux-screening means 21 and flux-concentrating means 20 are removed after orienting the axes of magnetization 11 of the pinning layers 10 in the applied magnetic field. $Ni_{80}Fe_{20}$ from which the patterns 20, 21 are made can be readily etched in a solution of phosphoric acid and hydrogen peroxide to which, if necessary, HF is added.

After removing the patterns 20, 21, a sensor is obtained which can suitably be used to measure magnetic fields.

Optionally, the pattern of flux-concentrating means 20 can be provided again near each magnetic element in order to further increase the sensitivity.

In the semimanufacture shown in FIG. 2, the axes of magnetization 11 of the pinning layers 10 of the elements in the first bridge portion 8 as well as of the elements in the second bridge portion 9 are oppositely oriented, and the elements in the first bridge portion 8 are also oppositely oriented to the elements in the second bridge portion 9. At this stage, the product is still referred to as a semimanufacture because the bridge is out of balance due to the presence of flux-concentrating means 14 for the first element 2 of the first bridge portion 8 and for the element of the second bridge portion 9 having the same orientation of the axis of magnetization as the first element 2.

Said unbalanced state of the bridge is remedied by removing the flux-concentrating means 14, after which a sensor is obtained which can very suitably be used to measure magnetic fields. A first embodiment of the sensor is shown in FIG. 2*c*.

At this orientation of the axes of magnetization 11 of the magnetic elements in the bridge configuration, a sensor based on the GMR or TMR effect yields the largest possible output signal at an applied voltage between the contacts 6, 7.

In the embodiment shown of the semimanufacture of FIG. 2, each magnetic element 2, 3, 4, 5 comprises a number of magnetic paths 16 which are connected in series by a metal 17. Said metal is, for example, Al or Cu which is patterned by means of a mask and physical or chemical etching.

In the embodiment shown of the semimanufacture for a compact sensor, the magnetic flux-concentrating means 14 are embodied so as to be a number of juxtaposed strips 18. The material of the strips has a high permeability and a high saturation magnetization. Suitable materials are compositions of, for example, Fe and Ni.

FIG. 2*a* shows that, in this embodiment, the contours of the flux-concentrating means 14 are situated at least substantially outside the magnetic paths 16 of the magnetic elements in the case of a substantially perpendicular projection of the contours on the magnetic elements 2, 3, 4, 5. In the embodiment shown, the flux-concentrating strips 18 are at a perpendicular distance of approximately 150 nm from the magnetic elements. In this configuration, the ratio between the width of the strips 18, which are typically 18 $\mu$m in width, and the width of the magnetic elements, which are typically 5 $\mu$m in width, is approximately a factor of 4. The sensitivity of the bridge increases, in this embodiment, by a factor of approximately 4.

The flux-screening means 15 are, for example, randomly shaped areas. The magnetic flux-screening means 15 are present for the second element 3 of the first bridge portion 8 and for the element of the second bridge portion 9 having the same orientation of the axis of magnetization 11 as the second element 3. In the embodiment shown in FIG. 2, the magnetic flux-screening means 15 are embodied so as to be a number of juxtaposed strips 30. If the strips 30 remain on the Wheatstone bridge, they will completely stop the magnetic field to be measured on a part of the Wheatstone bridge. As a result, only half the output signal issues from the bridge. On the other part of the bridge, the flux concentrators are situated, as a result of which said part of the bridge becomes approximately a factor of 4 more sensitive in the embodiment shown.

The flux-screening strips 30 are preferably situated at the smallest possible distance from the magnetic elements. The screening effect is improved by arranging the strips 30 on either side of the elements. In this embodiment, the dimensions of a strip 30 are such that, in the case of a substantially perpendicular projection of the flux-screening means 15 on the magnetic elements 2, 3, 4, 5, the magnetic paths 16 of the magnetic elements 2, 3, 4, 5 are situated within the edges 31 of the strips 30. If the material of the strips 30 is electrically conducting, preferably, a thin layer of an insulating material of, for example, AlOx, $SiO_2$ or $Si_3N_4$ is provided between the magnetic elements and the magnetic strips 30. In order to maximally screen the elements, the material of the strips 30 preferably has a high permeability. A permeability value of 2000 can be achieved using, for example, NiFe, CoNBZr, FeAlSi.

In general, the thickness of the areas substantially exceeds the thickness of the magnetic element, for example, by a factor of 100, in order to make sure that as many magnetic flux lines as possible of the applied magnetic field pass through the strips 30 during orienting instead of through the elements.

A second embodiment of the sensor is shown in FIG. 3. In FIG. 3, corresponding parts are indicated by means of the same reference numeral as in FIG. 2. In FIG. 3*a* and FIG. 3*b*, a second embodiment of the semimanufacture is visible, by means of which a very compact sensor is manufactured. In the semimanufacture, the magnetic flux-concentrating means 14 and the magnetic flux-screening means 15 are embodied so as to be strips 18 or strips 30 which preferably extend above (FIG. 3*b*), but also below (FIG. 3*a*), the magnetic paths.

The sensor shown in FIG. 3*c* is very compact and takes up a minimum amount of space. The magnetic paths 16 of each magnetic element 2, 3, 4, 5 are meanders. The meanders are nested. In this second embodiment, the meanders are bent so as to be U-shaped.

FIG. 4 shows the output voltage of a GMR-Wheatstone bridge configuration in accordance with the first embodiment shown in FIG. 2*c*. At a bias voltage of 5 V, the sensor has and linear output characteristic for small magnetic fields over a large temperature range of 20–200° C. Thus, small magnetic fields can be accurately measured. The GMR effect is 6% with a small hysteresis and an offset voltage drift of 0.7 V/K.

What is claimed is:

1. A method of orienting an axis of magnetization of a first magnetic element (2) with respect to a second magnetic element (3), wherein the first magnetic element (2) and the second magnetic element (3) are present on a substrate (1), and each of the magnetic elements (2, 3) comprises a magnetic layer (10) having an axis of magnetization (11), wherein the axis of magnetization (11) of the magnetic layer (10) of the first magnetic element (2) is oriented by providing a pattern of flux-concentrating means (20) close to at least the first magnetic element (2) and subsequently applying a magnetic field.

2. A method as claimed in claim 1, wherein the magnetic elements (2, 3) are heated to a temperature at which the axis of magnetization (11) of the first magnetic element (2) becomes oriented so as to extend parallel to and in the same direction as the direction of the applied magnetic field.

3. A method as claimed in claim 2, wherein the orientation of the axis of magnetization (11) is fixed by cooling in the presence of the magnetic field.

4. A method of manufacturing a sensor for measuring a magnetic field as claimed in claim 1, wherein a third magnetic element (4) and a fourth magnetic element (5) are present on the substrate (1), which third and fourth magnetic element form a bridge configuration with the first element (2) and the second element (3), which bridge configuration comprises a first bridge portion (8) between a first contact (6) and a second contact (7), wherein the first element (2) and the second element (3) are arranged in series, and a second bridge portion (9) wherein the third element (4) and the fourth element (5) are arranged in series, the third magnetic element (4) and the fourth magnetic element (5) also comprising at least a magnetic layer (10) with an axis of magnetization (11).

5. A method as claimed in claim 4, wherein the pattern of flux-concentrating means (20) is provided near the first magnetic element (2) of the first bridge portion (8) close to the first contact (6), and a similar pattern of flux-concentrating means (20) is provided near the magnetic element of the second bridge portion (9) close to the second contact (7) and, in the case of a substantially perpendicular projection thereof on the magnetic elements (2, 3, 4, 5), said elements demonstrate substantially no overlap.

6. A method as claimed in claim 4, wherein a pattern of flux-screening means (21) is formed near the second magnetic element (3) of the first bridge portion (8) close to the second contact (7), and a similar pattern of flux-concentrating means (20) is provided near the magnetic element of the second bridge portion (9) close to the first contact (7), the pattern of flux-screening means having edges (22) and, in the case of a substantially perpendicular projection thereof on the magnetic elements (2, 3, 4, 5), said magnetic elements being situated substantially within said edges (22).

7. A method as claimed in claim 6, wherein the pattern of flux-concentrating means (20) and the pattern of flux-screening means (21) are formed simultaneously.

8. A method as claimed in claim 7, wherein the patterns (20, 21) are made from one layer (24) of material having a comparatively high magnetic permeability.

9. A method as claimed in claim 8, wherein the pattern of flux-concentrating means (20) and the pattern of flux-screening means (21) are removed after orienting the axes of magnetization of the magnetic layer (10) in the applied magnetic field.

10. A method as claimed in claim 9, wherein the pattern of flux-concentrating means (20) is provided near each magnetic element (2, 3, 4, 5).

11. A method as claimed in claim 9, wherein the pattern of flux-screening means (20) is provided near each magnetic element (2, 3, 4, 5).

12. A method as claimed in claim 5, wherein the axes of magnetization (11) of the magnetic elements are oriented by using said method.

* * * * *